United States Patent [19]
Theus

[11] Patent Number: 5,113,148
[45] Date of Patent: May 12, 1992

[54] LINEAR CMOS OUTPUT STAGE

[75] Inventor: Ulrich Theus, Gundelfingen, Fed. Rep. of Germany

[73] Assignee: Deutsche ITT Industries GmbH, Freiburg, Fed. Rep. of Germany

[21] Appl. No.: 705,971

[22] Filed: May 28, 1991

[30] Foreign Application Priority Data

Jun. 7, 1990 [EP] European Pat. Off. ........ 90110765.6

[51] Int. Cl.$^5$ .......................... H03F 3/45; H03F 3/16
[52] U.S. Cl. .................................. 330/253; 330/255; 330/257
[58] Field of Search ............... 330/253, 255, 257, 264, 330/277, 261

[56] References Cited

U.S. PATENT DOCUMENTS

| | | | |
|---|---|---|---|
| 4,480,230 | 10/1984 | Brehmer et al. | 330/255 |
| 4,529,948 | 7/1985 | Bingham | 330/263 |
| 4,794,349 | 12/1988 | Senderowicz et al. | 330/253 |
| 4,803,441 | 2/1989 | Noro | 330/257 |
| 4,897,612 | 1/1990 | Carroll | 330/253 |
| 5,039,953 | 8/1991 | Su | 330/255 |
| 5,057,789 | 10/1991 | Nagaraj | 330/277 |

OTHER PUBLICATIONS

Joseph N. Babanezhad et al., "A Programmable Gain-/Loss Circuit," IEEE Journal of Solid-State Circuits, vol. SC-22, No. 6, Dec. 1987, pp. 1082-1089.

Primary Examiner—Eugene R. Laroche
Assistant Examiner—Tan Dinh
Attorney, Agent, or Firm—Thomas L. Peterson

[57] ABSTRACT

A class-AB push-pull CMOS output stage is driven over a control line with a drive potential from an input stage. The control line feeds the gate terminals of a complementary transistor pair whose first transistor serves as a first push-pull output transistor and whose second transistor is connected to the gate terminal of a second push-pull output transistor via a current-mirror arrangement. The source terminals of the first and second transistors are tied to a first fixed potential and a second fixed potential, respectively, the latter being stabilized by a low-impedance active compensation circuit.

8 Claims, 1 Drawing Sheet

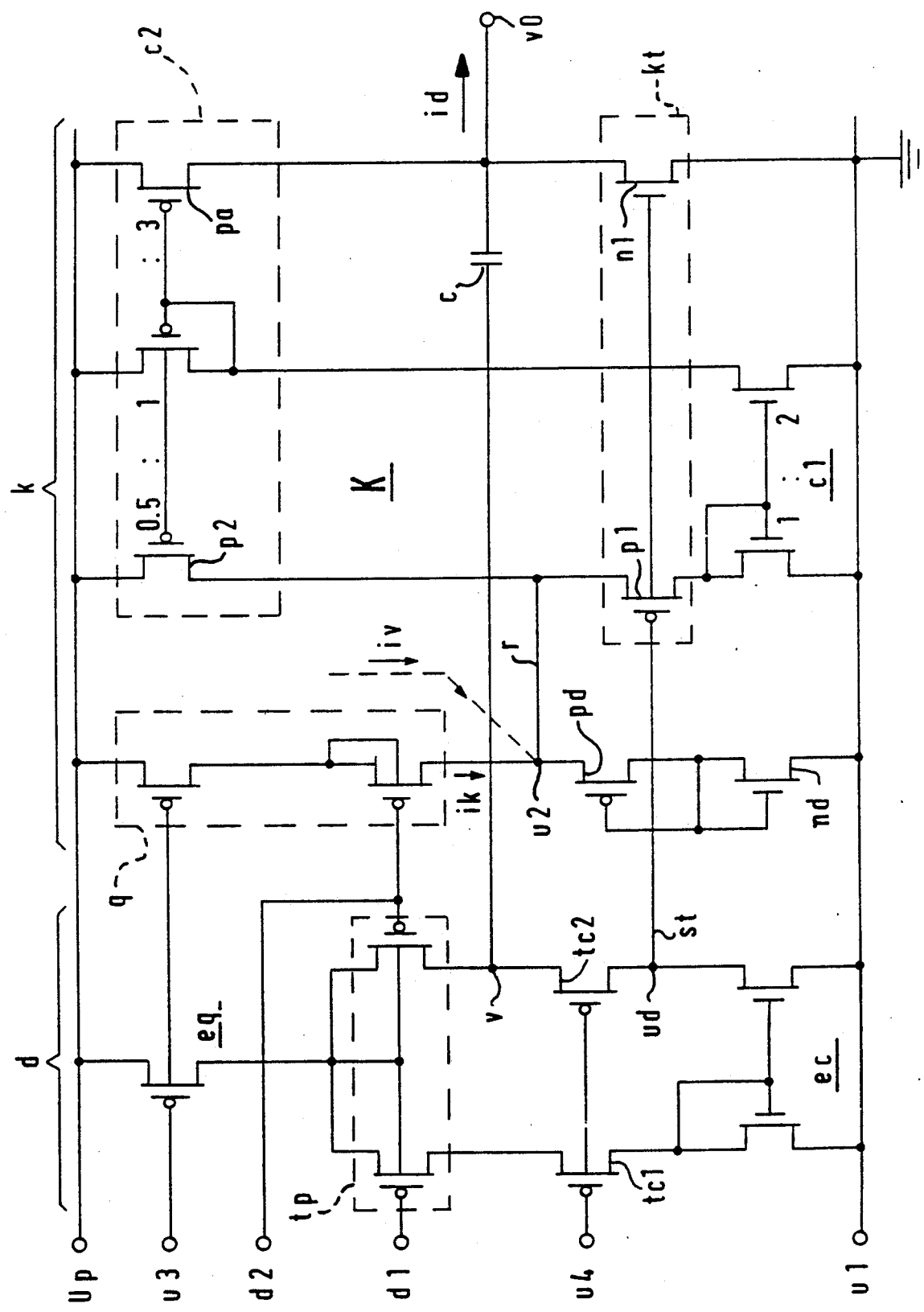

LINEAR CMOS OUTPUT STAGE

BACKGROUND OF THE INVENTION

1. Field of the Invention

The present invention is in the field of CMOS operational amplifiers, and, more particularly, is directed to an output stage for such an amplifier.

2. Description of the Related Art

The gain of push-pull output stages is generally dependent both on the signal frequency and, more or less, on the signal level. In the extreme case, at low signal levels, particularly in class-B operation, so-called crossover distortion results. The signal-level-dependent gain may adversely affect the processing of audio, measurement or other signals if low distortion is of particular importance. Through such changes in the gain of the output stage, the effective degree of negative feedback around operational amplifiers, for example, becomes dependent on the signal level, so that exact linearity throughout the drive range is not ensured.

From "IEEE Journal of Solid-State Circuits," Vol. SC-22, No. 6, December 1987, pages 1082-1089, especially page 1085 and FIGS. 6a and 6b, it is known to combine the square-law characteristics of a complementary field-effect-transistor pair such that the gain of the output stage becomes independent of the signal level. Use is made of the square-law current-voltage characteristics of an n-channel transistor and a p-channel transistor:

$$I_{DS} = \beta(U_{GS} - U_T)^2,$$

where $I_{DS}$ is the drain-source current, $U_{GS}$ is the gate-source voltage, $U_T$ is the constant transistor threshold, and $\beta$ is the transistor transconductance parameter. The complementary transistor pair is driven at the respective gate terminals by a common drive potential, with the source terminals of the two transistors connected to a first fixed potential and a second fixed potential, respectively. These fixed potentials are chosen so that throughout the drive range, neither of the two transistors leaves the respective square-law current-voltage characteristic, i.e., so that both transistors remain in their respective saturation regions. Therefore, this is also referred to as class-AB push-pull operation By passing the two output currents of the complementary transistor pair through a current mirror to a high-impedance current-difference stage, a differential current is generated in the latter which has the desired signal-level-independent proportional characteristic. By means of a load resistor, this differential current can be converted to a voltage signal, e.g., in an operational amplifier.

By the application of a common drive potential to the complementary transistor pair, the drain current of one of the transistors is reduced and that of the other transistor is increased The following simplified representation illustrates the strict proportionality of the differential current $I_D$ as a function of the respective gate-source voltage $U_{GS}$:

$$I_D = \beta(U_{GS} - U_T)^2 - \beta(-U_{GS} - U_T)^2$$

$$I_D = \beta(U_{gs}^2 - 2U_{GS}U_T + U_T^2 - I_{GS}^2 - 2U_{GS}U_T - U_t^2)$$

$$I_D = -4\beta U_{GS}U_T.$$

The drive potential is generated in an input stage which is designed in the above-cited article as a complementary cascode stage using differential technology.

The prior art circuit arrangement suffers from the drawback that the internally generated fixed potential is only stabilized via a combination of complementary diodes and a source follower, so that the impedance of the stabilizing circuit is not sufficiently low.

SUMMARY OF THE INVENTION

Accordingly, the object of the invention as claimed is to provide an improved class-AB push-pull CMOS output stage whose internal fixed potential is less load-dependent.

Besides the attainment of this object, a further advantage of the invention is that the necessary supply voltage can be lower than in the prior art circuit arrangement since the number of series-connected source-drain paths is reduced. This proves to be an advantage if the CMOS output stage in accordance with the invention forms part of a larger monolithic integrated circuit which is to use a supply voltage that is to be as low as possible for reasons of power dissipation.

BRIEF DESCRIPTION OF DRAWING FIGURE

The invention and further advantages will now be explained in more detail with reference to the accompanying drawing, which is a circuit diagram of an operational amplifier including the CMOS output stage in accordance with the invention.

DETAILED DESCRIPTION OF THE PREFERRED EMBODIMENT

The drawing shows a class-AB push-pull CMOS output stage k, which is driven via a control line st with a drive potential ud from an input stage d. The complete arrangement represents a CMOS operational amplifier whose input stage d is designed as a conventional differential-input stage.

The input of the CMOS output stage k is formed by the control line st, which is connected to the gate terminal of a first transistor n1 and to the gate terminal of a complementary second transistor p1. The two transistors form a complementary transistor pair kt, whose output currents are opposed to each other via a current mirror (described below) and a current-difference stage, which delivers the differential output current id at an output terminal vo. The first transistor n1 also serves as a first push-pull output transistor of the CMOS output stage, while a complementary second push-pull output transistor pa is connected via the described current mirror to the drain terminal of the second transistor p1.

The drain node, which is identical with the output terminal vo of the CMOS output stage k, forms the high-impedance current-difference stage. The source terminal of the first transistor n1 is tied to a first fixed potential u1, which is identical with ground potential, for example. The source terminal of the second transistor p1 is tied to a second fixed potential u2, which lies between ground potential and a positive supply voltage Up. The second fixed potential u2 is generated internally.

The second fixed potential u2 follows from the selected operating point of the first and second transistors n1 and p1, namely from the sum of their gate-source voltages (i.e., $U_{GS}$). These are balanced in a reference-voltage source formed by a series combination of an n-channel transistor nd and a p-channel transistor pd. Each of the two transistors is connected as a diode. The reference-voltage source is supplied with a constant current ik via an input terminal. The bottom end of the reference-voltage source is tied to the first fixed potential u1, and the input terminal is connected to the output of a constant-current source q. The operating point of the first and second transistors n1 and p1 of the complementary transistor pair kt can be balanced by the operating point and the design of the reference-voltage source so that the reference potential at the input terminal of the reference-voltage source is exactly equal to the necessary second fixed potential u2.

The reference potential u2 is applied to the source terminal of the second transistor p1 by means of a low-impedance compensation circuit K formed by a positive current feedback loop (i.e., "bootstrap circuit"). To this end, the compensation circuit K includes a first current mirror c1 and a second current mirror c2. The drain terminal of the second transistor p1 is coupled to the input of a first current mirror c1, which is complementary to the conductivity type of the second transistor p1. The output of the first current mirror c1, which has a current gain (i.e., a first ratio value) of 2, is coupled to the input of the second current mirror c2, whose first output transistor is the second push-pull output transistor pa and whose second output transistor p2 forms part of the compensation circuit K. The second output transistor p2 also causes a current reduction in the ratio of 2 to 1. The node of the drain terminal of this second output transistor p2 and the source terminal of the second transistor p1 is connected to the input terminal of the reference-voltage source by a compensation line r. In the quiescent condition, when the drive potential ud is at its quiescent value, the second output transistor p2 delivers just as much current as the constant-current source q. Consequently, no compensation current flows through the compensation line r. If the potential at the source terminal of the second transistor p1 changes, a compensation current flows through the compensation line r which causes a compensation current of the same magnitude in the output of the compensation circuit K (in the transistor p2), thereby compensating the current of the compensation line r. The compensation current thus restores the original second fixed potential u2.

The compensation circuit K is formed in a very simple manner from an addition to the current-difference stage. Between the second push-pull output transistor pa and the input of the second current mirror c2, current amplification by a factor of 3 takes place. Since at zero drive level the drain currents of the two push-pull output transistors n1, pa must be oppositely equal, it follows that at zero drive level the drain current of the first transistor n1 is six times as large as the drain current of the second transistor p1. The transconductances of the two complementary transistors n1, p1 thus differ by a second ratio value, namely the factor 6. At any other current transformation ratio of the two current mirrors c1, c2, the transconductances differ correspondingly. Preferred ratio values are 1 to 3 for the first ratio value and 3 to 10 for the second.

In the CMOS output stage k of the FIGURE, the second transistor p1, the reference diode pd, and the transistors of the second current mirror c2 and of the constant-current source q are of the p-channel conductivity type. The first transistor n1, the second reference diode nd, and the transistors of the first current mirror c1 are N-channel devices.

The input stage d shown in the drawing is a simple CMOS differential amplifier stage. It includes a p-channel differential amplifier transistor pair tp whose common source terminal is fed with the positive supply voltage Up via a p-channel input current source eq. The differential-input voltage is applied to a first gate terminal d1 and a second gate terminal d2 The drain terminals of the differential amplifier transistor pair tp are each connected to a respective p-channel cascode transistor tc1, tc2 The drain terminals of the two p-channel cascode transistors tc1, tc2 are connected to the input and output, respectively, of an n-channel input current mirror ec, which serves as an "active load." The output of the active load feeds the control line st with the drive potential ud. To provide internal negative frequency feedback, an integrated MOS capacitor c is connected from the output terminal vo to a node v in the input stage d The node v is located between the cascode transistor tc2 that provides the drive potential ud and the drain terminal of the transistor in the differential amplifier transistor pair tp which is connected to this cascode transistor tc1. Further, a first auxiliary potential u3 and a second auxiliary potential u4 are applied to the input stage d to establish the operating points of the input current source eq and the cascode transistors, respectively Instead of the input stage d shown in the FIGURE, other circuits can be employed, such as the complementary cascode stage referred to above.

In addition to being adjustable via the above-described current gain of the two current mirrors c1, c2, the overall transconductance of the CMOS output stage k is adjustable in particular via the constant current ik supplied by the constant-current source q. "Transconductance" as used herein is the ratio of the differential output current id to the input drive potential ud. If the constant-current source q is replaced by a variable control current iv (shown in phantom), the CMOS output stage k can be used to advantage as a variable-transconductance amplifier. The respective transconductance is directly proportional to the value of the variable control current iv. The signal whose amplitude is to be controlled must be applied as the drive potential ud to the control line st. In a similar fashion, an analog multiplier can be implemented.

What is claimed is:

1. A class-AB push-pull CMOS output stage for an amplifier having an input stage, said output stage driven with a drive potential from said input stage via a control line, said output stage comprising:

a complementary transistor pair comprising a first transistor and a second transistor, each having a gate terminal, a source terminal and a drain terminal, said control line feeding said gate terminals of said complementary transistor pair, said first transistor serving as a first push-pull output transistor;

a second push-pull output transistor having the same conductivity type as said second transistor of said complementary transistor pair, said second push-pull transistor having a gate terminal, a source terminal and a drain terminal;

a current mirror arrangement that interconnects said gate terminal of said second push-pull transistor and said drain terminal of said second transistor of said complementary transistor pair;

a first fixed potential connected to said source terminal of said first transistor in said complementary transistor pair;

a second fixed potential connected to said source terminal of said second transistor in said complementary transistor pair;

an output terminal connected to said drain terminal of said first transistor in said complementary transistor pair and said drain terminal of said second push-pull transistor to form a high-impedance current-difference stage providing a differential output current wherein the drain current of said second push-pull transistor is proportional to the drain current of said second transistor in said complementary transistor pair, and wherein throughout the range of said drive potential both said first transistor and said second transistor of said complementary transistor pair remain in the range of their respective square-law current-voltage characteristics:

$$I_{DS} = \beta(U_{GS} - U_T)^2,$$

and at zero drive level, the differential output current has a value of zero, said output stage further comprising:
an active compensation circuit having an output terminal;
a constant current source; and
a reference-voltage source comprising a series combination of a diode-connected n-channel transistor and a diode-connected p-channel transistor, wherein:
one terminal of said reference-voltage source is connected to said first fixed reference potential; and
an input terminal of said reference-voltage source is connected to said constant-current source and provides said second fixed potent- said input terminal being connected to said output terminal of said compensation circuit.

2. A class-AB push-pull CMOS output stage as defined in claim 1, wherein:
said current mirror arrangement comprises:
a first current mirror having an input transistor and an output transistor; and
a second current mirror comprising an input transistor and first and second output transistors;
said drain terminal of the second transistor in said complementary transistor pair is connected to said input transistor of said first current mirror;
said output transistor of said first current mirror is coupled to said input transistor of said second current mirror;
said first output transistor of said second current mirror is said second push-pull output transistor;
said second output transistor of said second current mirror operates as a current source and feeds said source terminal of said second transistor of said complementary transistor pair, said second output transistor forming said output terminal of said compensation circuit;
said constant-current source is of the same channel-conductivity type as said input transistor and said output transistors of second current mirror; and
said input terminal of said reference-voltage source is connected to said source terminal of said second transistor in said complementary transistor pair.

3. A class-AB CMOS output stage as defined in claim 2, wherein:
said output current of said constant-current source is substantially equal to the quiescent current of said second output transistor of said second current mirror; and
the quiescent output current of said first current mirror has a first ratio value with respect to said output current of said constant-current source, and the quiescent current through the first and second push-pull output transistors has a second ratio value with respect to said output current of said constant-current source.

4. A class-AB CMOS output stage as defined in claim 2, characterized in that the first and second transistors of the complementary transistor pair are of the p-channel type and the n-channel type, respectively.

5. A variable-conductance amplifier in the form of a class-AB CMOS output stage, said amplifier driven with a drive potential via a control line, said drive potential comprising a voltage signal to be controlled in amplitude, said amplifier comprising:
a complementary transistor pair comprising a first transistor and a second transistor, each having a gate terminal, a source terminal and a drain terminal, said control line feeding said gate terminals of said complementary transistor pair, said first transistor serving as a first push-pull output transistor;
a second push-pull output transistor having the same conductivity type as said second transistor of said complementary transistor pair, said second push-pull transistor having a gate terminal, a source terminal and a drain terminal;
a current mirror arrangement that interconnects said gate terminal of said second push-pull transistor and said drain terminal of said second transistor of said complementary transistor pair;
a first fixed potential connected to said source terminal of said first transistor in said complementary transistor pair;
a second fixed potential connected to said source terminal of said second transistor in said complementary transistor pair;
an output terminal connected to said drain terminal of said first transistor in said complementary transistor pair and said drain terminal of said second push-pull transistor to form a high-impedance current-difference stage providing a differential output current wherein the drain current of said second push-pull transistor is proportional to the drain current of said second transistor in said complementary transistor pair, and wherein throughout the range of said drive potential both said first transistor and said second transistor of said complementary transistor pair remain in the range of their respective square-law current-voltage characteristics:

$$I_{DS} = \beta(U_{GS} - U_T)^2,$$

and at zero drive level, the differential output current has a value of zero, said output stage further comprising:
an active compensation circuit having an output terminal;
an input that receives a variable control current; and a reference-voltage source comprising a series combination of a diode-connected n-channel transistor and a diode-connected p-channel transistor, wherein:
one terminal of said reference-voltage source is connected to said first fixed reference potential; and
an input terminal of said reference-voltage source is connected to said input to receive said variable control current, said input terminal providing said second fixed potential, said input terminal of said reference-voltage source being connected to said output terminal of said compensation circuit, said amplifier having a transconductance which is the ratio of the differential output current to the input drive potential, said transconductance varying in response to said variable control current.

6. A CMOS differential amplifier comprising:
a differential-input stage comprising:
a differential amplifier transistor pair comprising first and second transistors, wherein the source terminals of said first and second transistors in said pair are interconnected to provide a common source terminal;
an input current source that supplies current to said common source terminal; and
a current mirror that couples the drain terminals of said first and second transistors in said differential amplifier transistor pair, said current mirror serving as an active load having an output terminal, said output terminal of said active load providing a drive potential via a control line;
a class-AB push-pull CMOS output stage driven by said drive potential from said input stage via said control line, said output stage comprising:
a complementary transistor pair comprising a first transistor and a second transistor, each having a gate terminal, a source terminal and a drain terminal, said control line feeding said gate terminals of said complementary transistor pair, said first transistor serving as a first push-pull output transistor;
a second push-pull output transistor having the same conductivity type as said second transistor of said complementary transistor pair, said second push-pull transistor having a gate terminal, a source terminal and a drain terminal;
a current mirror arrangement that interconnects said gate terminal of said second push-pull transistor and said drain terminal of said second transistor of said complementary transistor pair;
a first fixed potential connected to said source terminal of said first transistor in said complementary transistor pair;
a second fixed potential connected to said source terminal of said second transistor in said complementary transistor pair;
an output terminal connected to said drain terminal of said first transistor in said complementary transistor pair and said drain terminal of said second push-pull transistor to form a high-impedance current-difference stage providing a differential output current wherein the drain current of said second push-pull transistor is proportional to the drain current of said second transistor in said complementary transistor pair, and wherein throughout the range of said drive potential both said first transistor and said second transistor of said complementary transistor pair remain in the range of their respective square-law current-voltage characteristics:

$$I_{DS}=\beta(U_{GS}-U_T)^2,$$

and
at zero drive level, the differential output current has a value of zero,
said output stage further comprising:
an active compensation circuit having an output terminal;
a constant current source; and
a reference-voltage source comprising a series combination of a diode-connected n-channel transistor and a diode-connected p-channel transistor, wherein:
one terminal of said reference-voltage source is connected to said first fixed reference potential; and
an input terminal of said reference-voltage source is connected to said constant-current source and provides said second fixed potential, said input terminal being connected to said output terminal of said compensation circuit.

7. A CMOS differential amplifier as defined in claim 6, further comprising:
an integrated MOS capacitor; and
first and second cascode transistors of the same conductivity type as said first and second transistors in said differential amplifier transistor pair in said input stage, said first cascode transistor connected between the drain terminal of said first transistor in said differential amplifier transistor pair and a first terminal of said active load, said second cascode transistor connected between the drain terminal of said second transistor in said differential amplifier transistor pair and a second terminal of said active load, the connection between said second cascode transistor and said second terminal of said active load providing said drive potential, the connection between said second cascode transistor and said second transistor in said differential amplifier transistor pair being connected through said integrated MOS capacitor to said output terminal of said CMOS output stage.

8. A CMOS differential amplifier as defined in claim 7, wherein said differential amplifier transistor pair comprises two identical p-channel transistors.

* * * * *